United States Patent [19]

Gee et al.

[11] Patent Number: 4,460,982

[45] Date of Patent: Jul. 17, 1984

[54] INTELLIGENT ELECTRICALLY PROGRAMMABLE AND ELECTRICALLY ERASABLE ROM

[75] Inventors: Lubin Gee, Santa Clara; Pearl Cheng, Sunnyvale; Yogendra Bobra, Santa Clara; Rustam Mehta, Sunnyvale, all of Calif.

[73] Assignee: Intel Corporation, Santa Clara, Calif.

[21] Appl. No.: 380,149

[22] Filed: May 20, 1982

[51] Int. Cl.$^3$ ............................................. G11C 11/40
[52] U.S. Cl. ................................. 365/189; 365/104; 365/218; 371/21
[58] Field of Search ..................... 365/189, 218, 104; 371/21

[56] References Cited

U.S. PATENT DOCUMENTS

| 4,203,158 | 5/1980 | Frohmann-Beutchkowsky | 365/185 |
| 4,266,283 | 5/1981 | Pergelos | 365/104 |
| 4,363,109 | 12/1982 | Gardner | 365/218 |

Primary Examiner—Terrell W. Fears
Attorney, Agent, or Firm—Blakely, Sokoloff, Taylor & Zafman

[57] ABSTRACT

An E$^2$PROM is disclosed which provides automatic programming verification. Before data is written into the cells, the cells are automatically erased. The contents of the cells are checked to verify that erasing has been completed. If it has not, erasing is continued until the cells are erased. When data is written into the cells, the writing of the data into the cells continues until programming is verified. The verification is conducted at potentials other than the normal reference potential to assure that the cells are well programmed with either binary zeroes or binary ones.

11 Claims, 5 Drawing Figures

PULSE GENERATOR.

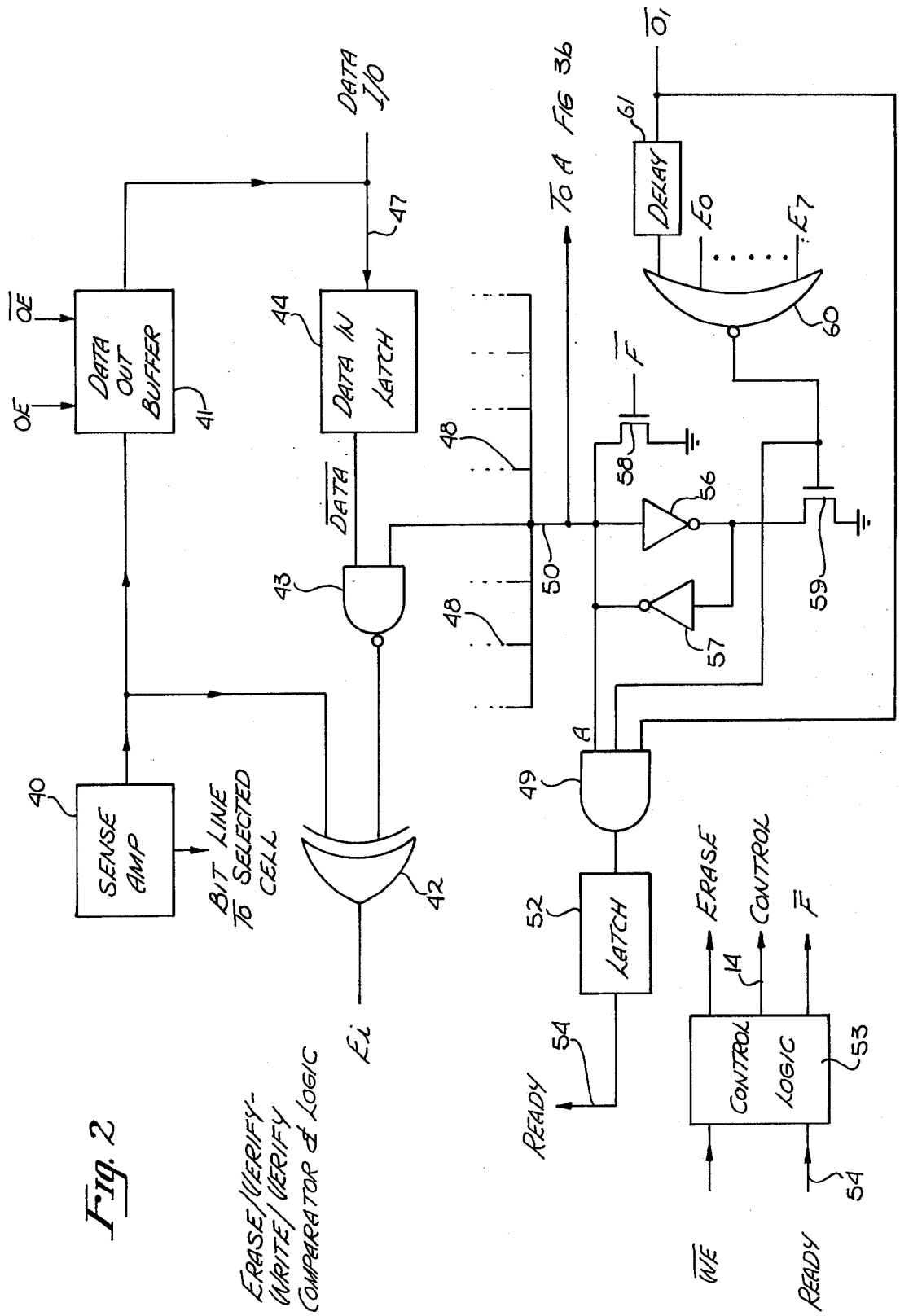

INTELLIGENT ELECTRICALLY PROGRAMMABLE AND ELECTRICALLY ERASABLE ROM

BACKGROUND OF THE INVENTION

1. Field of the Invention

The invention relates to the field of electrically programmable and electrically erasable read-only memories.

2. Prior Art

For many years now, electrically programmable read-only memories (EPROMs) have been commercially available. More recently, an electrically programmable and electrically erasable memory (E²PROM) employing floating gate devices has been commercially available under the Part No. 2816 from Intel Corporation. Aspects of this memory are described in U.S. Pat. Nos. 4,203,158 and 4,266,283. This application describes improvements to this memory.

In programming a 2816, it is recommended that 10 millisecond pulses be employed; and, then the memory is read to verify proper programming. It can take approximately 20 seconds to program this 16 k memory. A 10 millisecond pulse is longer than is required for most cells, however, this longer pulse is used to assure that even the hardest to program cells are programmed. As will be seen, the present invention uses substantially shorter pulses to program the cells and then automatically verifies programming. If the programming is not completed, automatic reprogramming occurs until the intended program is verified. This substantially shortens the time required for programming the memory. Other techniques are described which assure reliable verification.

In programming the 2816 it is recommended that the programming pulses have ramped leading edges. These pulses are generated external to the chip by the user and applied to the memory for programming. The ramped leading edges tend to prolong the life the thin oxides through which charge is tunnelled. As will be seen, the present invention discloses an on-chip pulse generator.

SUMMARY OF THE INVENTION

An improvement in an electrically programmable and electrically erasable memory fabricated on a substrate is described. The memory includes a plurality of memory cells which require a first potential for reading data and a second, higher potential for writing data and erasing data. The improvement includes a latching means for receiving and temporarily storing data. A pulse generation means generates pulses used to write data into the cells. This generation means is coupled to receive the second potential. A comparator means compares the data in the latching means with the data in the cells. A control means controls the pulse generation means such that pulses are repeatedly generated until the data in the latching means matches the data in the cells. In this manner, writing pulses of shorter duration may be used since the pulses are repeated until the cells are programmed.

BRIEF DESCRIPTION OF THE DRAWINGS

FIG. 2 is an electrical schematic and block diagram illustrating the comparator means used to verify both the erasing and writing of data into the memory.

FIG. 3b is an electrical schematic of the control circuitry used to control the circuit of FIG. 3a.

DETAILED DESCRIPTION OF THE INVENTION

Figure 1:
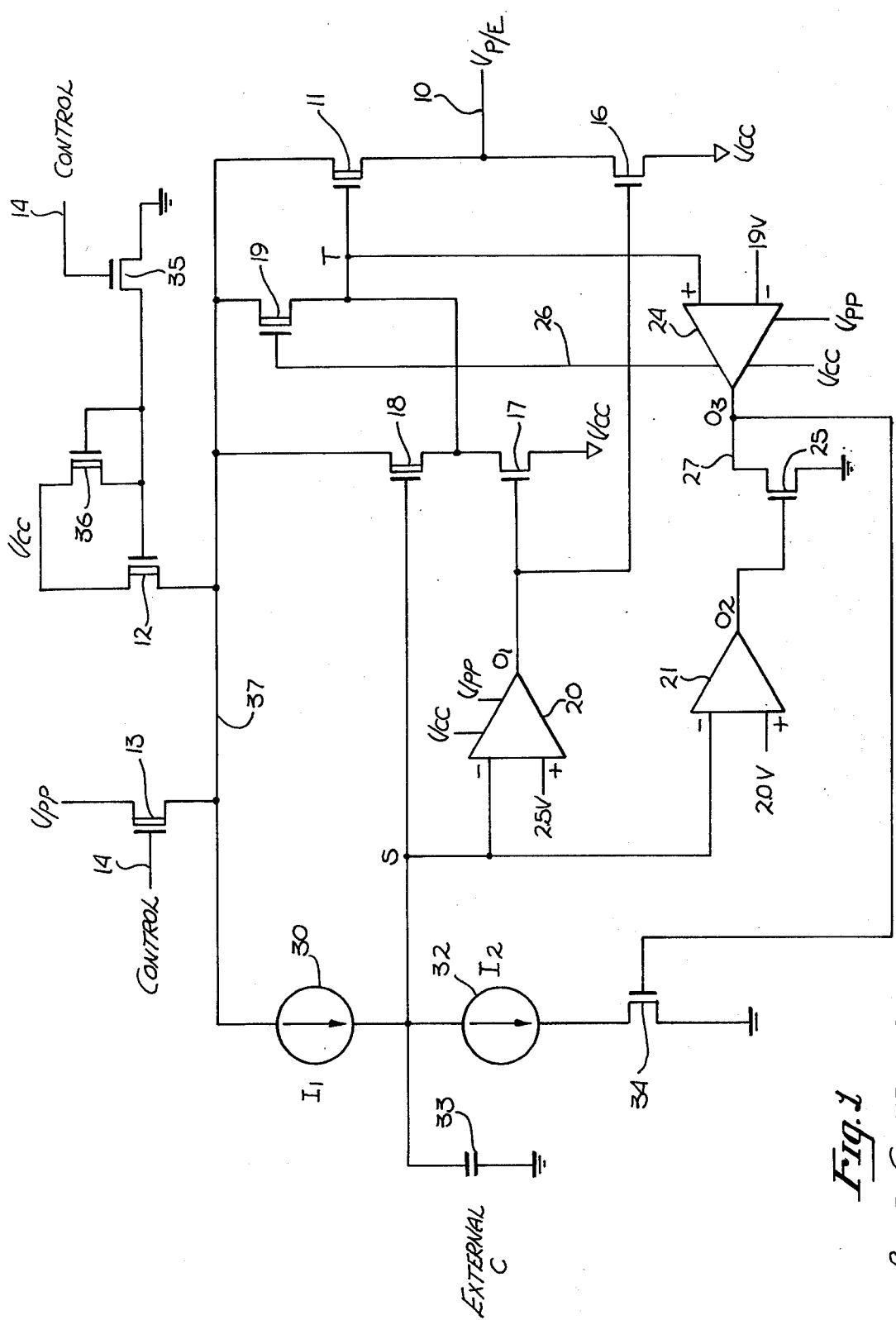
FIG. 1 is an electrical schematic showing the pulse generator which is included on the substrate with the memory.

Improvements in an electrically programmable and electrically erasable read-only memory (E²PROM) are described. In the following description, numerous specific details are set forth such as specific voltages, etc. in order to provide a thorough understanding of the present invention. It will be obvious to one skilled in the art, however, that the invention may be practiced without these specific details. In other instances, well-known circuits are shown in block diagram form in order not to unnecessarily obscure the present invention.

In its presently preferred embodiment, the invented memory is organized as a 2 k×8 read-only memory. The memory utilizes 5 volts ($V_{CC}$) during normal read cycles. A higher potential is required for programming the cells and for this purpose, a 21 volt potential ($V_{pp}$) is externally applied to the memory. (This potential can be generated on-chip from the 5 volt supply using well-known circuits). As presently implemented, the $V_{pp}$ potential is always applied to the memory, that is, even during the read cycles. All switching of this potential is done within the memory.

The memory cells employed with the present invention are described in U.S. Pat. No. 4,203,158. Each cell includes a floating gate which is charged and discharged through a thin oxide region. A control gate is disposed above and insulated from the floating gate.

The term "programming" as used herein, refers to either the erasing or writing of data, or both. When the floating gate is erased for purposes of this application it will be assumed that it is storing a binary one. For this condition, electrons are stored on the floating gate and the cell does not conduct when the reference potential of 3 volts is applied to the control gate. To achieve this condition, that is, to erase the cell, the high voltage pulses are applied to the control gate while the drain terminal of the cell is held at ground. When a cell is storing a binary zero, its floating gate is discharged, that is, it is uncharged. "Write" is used to describe the programming of a binary zero into the cell. The binary zero is written in the cell by applying the high voltage pulses to the drain terminal while the control gate is grounded. For this condition, when the reference potential of approximately 3 volts is applied to the control gate, the cell conducts.

The memory in its presently preferred embodiment is fabricated employing metal-oxide-semiconductor (MOS) technology and more particular, n-channel devices with polysilicon gates are used. In addition to the cells, depletion mode transistors having a threshold voltage of approximately −3 volts, enhancement mode transistors having a threshold voltage of approximately +0.7 volts and zero threshold transistors having a threshold voltage of approximately 0 volts are used.

The memory includes well-known input and output buffers, decoders and other known circuits. As mentioned, some aspects of this memory, particularly the word erase feature is described in U.S. Pat. No. 4,266,283.

Referring first to FIG. 1, the pulse generator provides output pulses on line 10 which are used both during erasing and writing. These signals are generated when the control signal on line 14 is high. When the control signal is in its lower state, the node 37 of the generator is decoupled from the high voltage potential ($V_{pp}$) since the depletion mode transistors 13 does not conduct. Rather, node 37 is coupled to $V_{CC}$ through the depletion mode transistor 12 since transistor 36 pulls the gate of transistor 12 to the $V_{CC}$ potential. When the control signal is high, transistor 35 conducts, decoupling node 37 from the $V_{CC}$ potential, thereby allowing it to rise to the $V_{pp}$ potential.

The pulse generator of FIG. 1 utilizes three comparator circuits, comparators 20, 21 and 24. The comparator 20 compares the potential on node S with 2.5 volts and when node S reaches this potential, the $O_1$ signal goes high (i.e., rises to $V_{pp}$), causing transistor 17 to conduct. The $O_1$ signal and $O_{1/}$ signal are used elsewhere as will be described later.) Comparator 21 compares the potential on node S with 2 volts and when node S reaches the 2.0 volt potential, the $O_2$ signal goes high causing transistor 25 to conduct. The comparator 24 compares the potential on node T with 19 volts and when node T reaches this potential the $O_3$ signal goes high. Two outputs are provided by the comparator 24. One, which rises to 5 volts, is coupled to the gate of transistor 34. The other rises to the $V_{pp}$ potential and is coupled to the gate of transistor 19 via line 26.

The $V_{pp}$ potential on node 37 is coupled to line 10 primarily through the depletion mode transistor 11. The gate of this transistor is controlled by transistors 17, 18 and 19 as will be described. Line 10 is brought to Vcc potential through the transistor 16.

Figure 4:
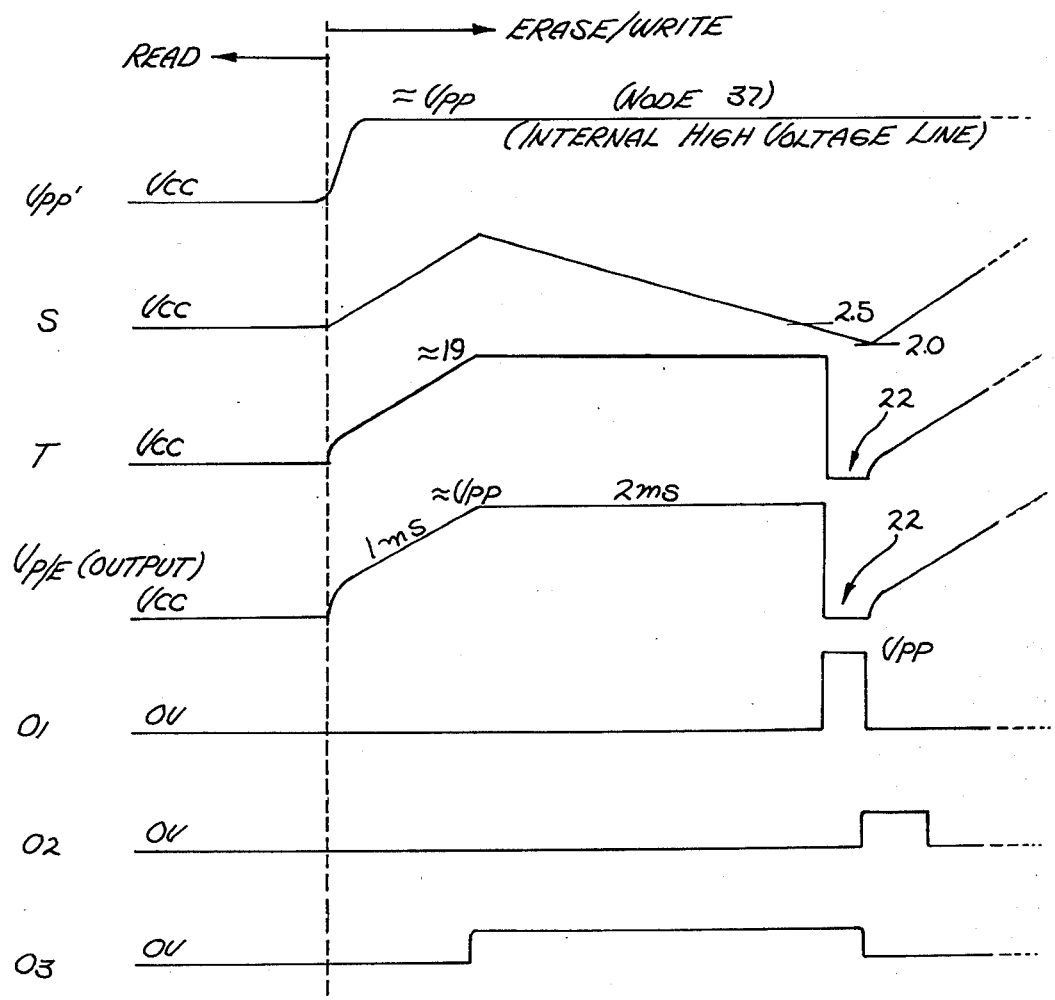
FIG. 4 illustrates a series of waveforms used to describe the operation of the present invention.

Referring now to both FIGS. 1 and 4, assume that the control signal on line 14 rises in potential. When this occurs, node 37 is drawn to $V_{PP}$ as shown in FIG. 4. This occurs during erasing or writing, otherwise (during reading) the node is at $V_{CC}$.

Node S now begins to rise towards the $V_{PP}$ potential since it is charged by the constant current source 30. The relatively large external capacitor 33 is charged. The relative slow charging of this capacitor provides the "ramped" leading edge of the output waveform. As node S rises in potential, transistor 18 conducts, pulling-up node T. This, in turn, causes transistor 11 to conduct, bringing up the potential on line 10. (The waveforms on nodes S and T and line 10 are shown in FIG. 4.) The potential on node T continues to rise until it reaches 19 volts. When this occurs, the $O_3$ signal goes high, causing transistors 19 and 34 to conduct. The constant current source 32 begins to conduct, and since I2 is approximately twice as large as I1 node S begins to drop in potential as seen in FIG. 4. Node T, on the other hand, does not drop in potential since it is maintained high through transistor 19. When node S reaches 2.5 volts, an output occurs from the comparator 20 as shown by the $O_1$ signal. This causes both transistors 16 and 17 to conduct. At this time, the output signal drops sharply for period 22. The gate of transistor 11 is also pulled down sharply as shown by the waveform for node T.

When the potential on node S reaches 2 volts, the output of the comparator 21 causes transistor 25 to conduct discharging node 27. This prevents node S from falling lower since transistor 34 is cut off. With this, the period 22 of FIG. 4 ends. If the control signal is high, node S begins to rise again in potential and additional pulses are generated.

As is seen in FIG. 4, the output pulses ($V_{P/E}$) has a ramp leading edge and then remains high for approximately 2 milliseconds. As mentioned, this waveform with its ramped leading edge is desirable for programming (both erasing and writing) the memory cells. Most of the time, a 2 millisecond pulse is all that is required to program a cell. During the period 22, as will be described, the data in the cells is checked to determine if the erasing or writing was carried out. The data stored in the cells is read from the cells and compared during this period. If it does not compare with the desired programming, an additional pulse is generated, and again, the contents of the cells are checked. This will be described in more detail in conjunction with FIG. 2. As long as the control signal remains high, the pulses are generated. Once the control signal drops in potential, then the output line 10 of the generator remains at $V_{CC}$.

As presently implemented, when it is necessary to program the memory, the new data is first latched into a buffer, 8 bits at a time (note the memory is organized as a byte-wide memory) Initially, the data is ignored and an erase cycle is conducted. The cells are checked to assure that they have been erased, that is, programmed with binary ones. Now the data is examined. If it consists of all binary ones, no additional programming occurs and a READY signal indicates the memory may be used as a read-only memory or that programming of other cells can occur. If the input data is not all binary ones, then writing occurs to program cells with the binary zeroes. Again, the contents of the cells are compared with the latched data and the short programming pulses are continually generated until programming has been completed.

The circuitry associated with this programming is shown in FIG. 2. A single sense amplifier 40 is shown which is coupled to the selected cell. Also, a single output buffer 41 is shown. This buffer receives both an output enable and output enable/signal. A data-in buffer and latch 44 is coupled to line 47 as is the data-out buffer. The input and output data is multiplexed in the presently preferred embodiment. The data-in latch 44 provides the complement of the data to the inverting AND gate 43. The output of gate 43 is coupled to one input terminal of the exclusive OR-gate 42. The other input terminal to this gate receives the data sensed by the sense amplifier 40. With a bytewide memory it will be appreciated that 8 sense amplifiers 40, buffers 41, data-in buffer and latch 44, gates 42 and 43 are used with one input terminal of each of the 8 gates 43 being coupled to node 50. This is indicated generally by the lines 48.

The output of each of the gates 42 shown as $E_i$ are coupled to an inverting OR-gate 60 ($E_0$ through $E_7$). The $O_{1/}$ signal is slightly delayed by delay means 61 and provides another input to the gate 60. This signal is the complement of the signal shown in FIG. 4 and is generated within the pulse generator of FIG. 1. The output of the gate 60 is coupled to the gate of transistor 59 and also provides one input to the AND gate 49. $O_{1/}$ is also coupled to an input terminal of gate 49. Transistor 59 is coupled to node 50 through the inverters 56 and 57. Node 50 is selectively coupled to ground through the transistor 58. The signal on node 50 is designated as "A" and is coupled as an additional input to the AND gate 49. This signal and its complement are used in the circuit of FIG. 3b as will be described later. The output of the AND gate 49 is coupled through a latch 52 and provides a READY signal on line 54.

A control logic means 53 which is part of the memory's timing circuitry, provides several control signals including "ERASE", "CONTROL", "F/". Ordinary logic circuits are used to generate these signals. The timing of these signals will be apparent from the description below.

When the memory is operated as a read-only memory, F/ remains high, coupling node 50 to ground. The circuitry of FIG. 2 is inactive except that the sense amplifier 40 senses data and couples it to the output line through the data-out buffer 41.

Assume now that the cells are to be programmed. Node 50 is initially at ground potential; the inverters 56 and 57 act as a latch to assure this node remains grounded at this time. When the WE/ signal drops in potential, the addresses for the select 8 cells are latched. When the signal next goes high, the input data is latched and stored in the data-in buffer and latch 44 and like buffers. At this time, since programming is to occur, the F/ signal is low and when the WE/ signal rises in potential to latch the data, an ERASE signal is provided by the control logic means 53. This ERASE signal couples the generator of FIG. 1 to the control gates of the addressed cells and also couples their drain terminal to ground, allowing these cells to be erased by pulses from the pulse generator of FIG. 1. Also the control signal on line 14 is high, causing pulses to be generated as shown in FIG. 4.

During this erasing, since node 50 is low, the conditions of AND gate 43 cannot be met and thus the data in latch 44 is ignored. A high signal is provided by the inverting AND gate 43 to the exclusive OR gate 42. Assume initially that at least one of the addressed 8 cells contains a binary zero. When the first pulse from the pulse generator is generated, this cell should be erased. During the period 22 of FIG. 4 and after each pulse from the pulse generator, the sense amplifier 40 senses the contents of the cell and the sensed data is coupled to the gate 42 and like gates. The data in the cells is now verified. If all the inputs to the gates 42 are high, indicating that erasure has occurred, the outputs of the gates 42 drop in potential. For the above conditions, the inputs $E_0$ through $E_7$ coupled to the gate 60 are low. During the period 22, $0_1/$ is also low. This causes a high output from gate 60. When transistors 59 conducts, node 50 is driven high and latched high by inverters 56 and 57.

If the first pulse from the generation of FIG. 1 did not erase all 8 cells, then at least one of the inputs $E_0$ through $E_7$ to the gate 60 would remain high, preventing transistor 59 from conducting. For this condition, the ERASE signal and the control signal from the control logic means remains high and pulses are continually generated by the generator of FIG. 1 until erasing has been completed.

Once the erasing has been completed, the rise in potential on node 50 immediately couples the data from the data-in latch through the gate 43 to the exclusive OR gate 42. If the data-in latch 44 contains a binary one, the output of the gate 42 remains low. If all the inputs $E_0$ through $E_7$ to gate 60 remain low, the output of this gate remains high and all the conditions of gate 49 are met. The output of gate 49 rises and this potential is latched by latch 52 providing a READY signal on line 54. The READY signal when coupled to the control logic means 53 causes the control signal on line 14 to drop in potential allowing the memory to receive additional data for programming or allowing the memory to operate in a read-only mode.

If the comparison of the complement of the data from the latch 44 and the sensed data from the amplifier 40 do not match, the output from at least one of the gates 42 remains high. Then, after the erasing and verification, one of the inputs to the gate 60 is high, causing the output from gate 60 to be low. At this time, node 50 is high, but since the output of gate 60 is low, a READY signal is not generated. The control signals from control logic means 53 remains high, however, this time pulses are generated for writing rather than erasing. These pulses are coupled to the drain terminals of those cells which are to be programmed with the binary zeroes. Once again, the pulses are continually generated until these cells have been programmed with binary zeroes. When this occurs, all the inputs to the gate 60 are low, and when the $0_1/$ signal drops in potential, all the inputs to the gate 49 are high providing a READY signal on line 54. Again, once the READY signal is present, it is known that the cells have been programmed and that the data verified within them.

During the reading of data from both the described memory and the 2816, the control gates receive a reference potential. This potential is generated on the substrate from a dummy cell in a known manner. With the present invention, after erasing and during the verification of the binary ones, the reference potential is raised by approximately $\frac{1}{2}$ volt. This will cause cells which have been only marginally erased to conduct, and this in turn will cause additional pulses to be generated, and consequently assure completed erasing. Similarly, after writing, the reference potential is lowered by approximately $\frac{1}{2}$ volts during verification. Marginally programmed cells will now not conduct causing additional pulses to be generated, thereby reinforcing the writing.

Figure 3A:
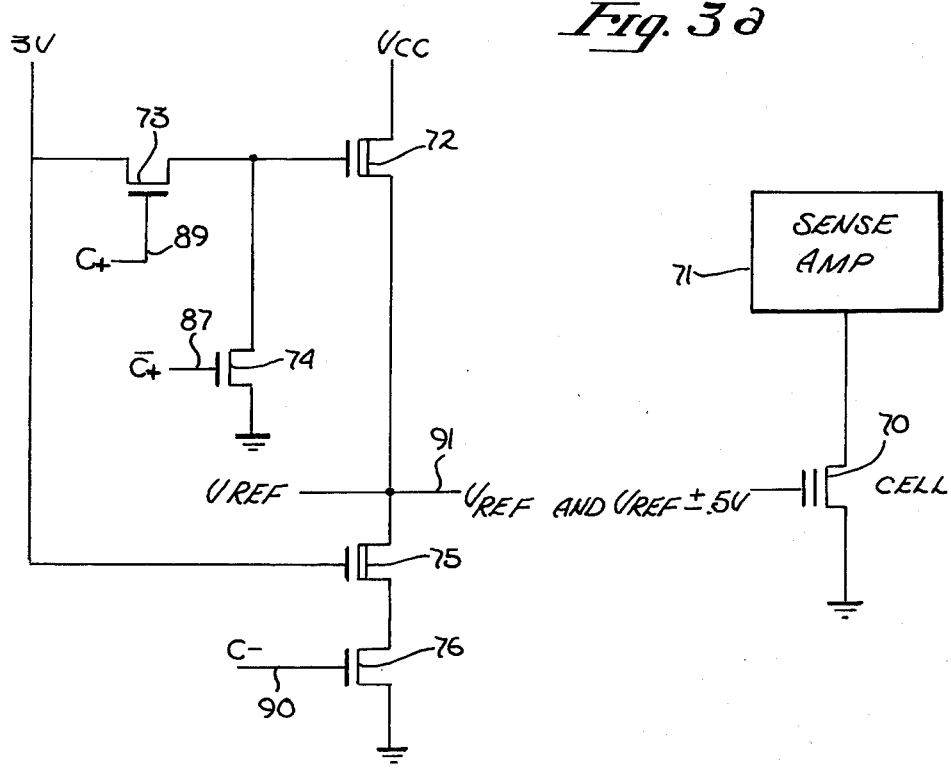
FIG. 3a is an electrical schematic illustrating the circuit used to generate both the high and low reference potentials used during the verification of data.
Figure 3B:
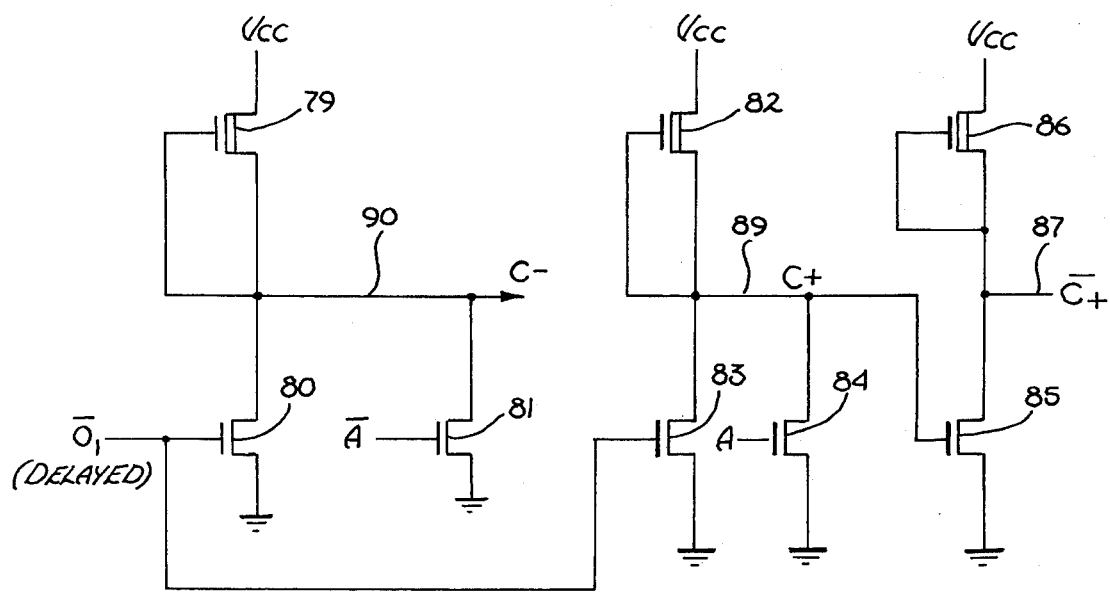

The circuit for providing the higher and lower reference potential during verification is shown in FIGS. 3a and 3b. Referring to FIG. 3a, the reference potential on line 91 is coupled to the cells such as cell 70. (A single sense amplififer 71 is shown directly coupled to cell 70.) During ordinary read cycles, C+ and C− are both low. The C+ signal on line 89 prevents transistor 73 from conducting. Since the C+/ signal on line 87 is high, transistor 74 conducts, preventing transistor 72 from otherwise conducting. The C− signal on line 90 prevents transistor 76 from conducting, thus even though transistor 75 is slightly conductive, line 91 is not affected. Therefore, line 91 remains at $V_{REF}$. Referring to FIG. 3b, when reading is occurring, (except for verification) $0_1/$ is high, causing both transistors 80 and 83 to conduct. This couples line 90 to ground through transistor 80 assuring that the C− signal is low. Similarly, since transistor 83 conducts, line 89 is at ground potential, assuring that C+ is low. Transistor 85 is not conducting and thus line 87 is drawn to $V_{CC}$ through transistor 86 causing the C+/ signal to rise in potential.

After erasing and during the erase verification, $0_1/$ drops in potential and A (node 50 of FIG. 2) remains low. Transistor 81 conducts, keeping line 90 at ground potential. However, transistors 83 and 84 do not conduct during period 22 of FIG. 4, causing line 89 to be pulled to $V_{CC}$ through transistor 82 and dropping the potential on line 87. Now referring to FIG. 3a, transistor 76 remains off, however, transistor 73 conducts and transistor 74 is turned-off. This brings the gate of transistor 72 to approximately 3 volts. The potential on line 91 is then raised by approximtely ½ volt by the depletion mode transistor 72.

After writing and during verification, A is high and A/ low. Neither transistors 80 nor 81 conduct and thus C− is high. Since transistor 84 conducts, C+ is low, and C+/ high. In FIG. 3a, this causes transistor 76 to conduct and prevents transistor 72 from conducting. A current path thus exists from line 91 to ground which pulls line 91 low by approximately ½ volt. Therefore, during the writing verification, the control gates of the cells are at a lower potential.

The ERASE/VERIFICATION and WRITE/VERIFICATION cycles as above discussed, allow much shorter programming pulses to be used (e.g., 10 milliseconds vs. 2 milliseconds). Most of the time a single shorter pulse is all that is required. As described, if a single pulse does not properly program a cell, the pulses are repeated until the cell is programmed. In practice, this allows the memory to be programmed in a substantially shorter time than with a prior art E²-PROM. Moreover, the automatic on-chip verification makes the memory easier to use. The higher and lower reference potentials used during verification identifies marginally programmed cells and provides for automatic reprogramming.

Thus, an electrically programmable and electrically erasable read-only memory has been described with improved programming capability.

We claim:

1. In an electrically programmable and electrically erasable memory fabricated on a substrate employing a plurality of memory cells which require a first potential for reading data and a second higher potential for programming data, an improvement on said substrate comprising:
    latching means for receiving and temporarily storing data;
    pulse generation means for generating pulses used to program said cells with said data, said generation means coupled to receive said second potential;
    comparator means for comparing data in said latching means with data in said cells; and,
    control means for controlling said pulse generation means, such that said pulses are repeatedly generated until data in said latching means matches data in said cells, said control means being coupled to said comparator means and said pulse generation means;
    whereby programming pulses are repeatedly generated until said data is programmed into said cells.

2. The improvement defined by claim 1 wherein said control means first causes said pulse generation means to erase data in said cells prior to the writing of said data into said cells.

3. The improvement defined by claim 2 wherein said control means generates a signal indicating that data has been written into said cells, thereby allowing said latching means to receive new data.

4. The improvement defined by claim 3 wherein said pulse generation means generates pulses having ramps on their leading edges.

5. The improvement defined by claim 4 wherein said pulses are substantially shorter than 10 milliseconds in duration.

6. The improvement defined by claim 1 and claim 5 wherein a reference potential is applied to said cells when data is read from said cells and wherein during said comparison by said comparator means a potential other than said reference potential is used to assure that said data in said cells is readable under adverse conditions.

7. In an electrically programmable and electrically erasable memory fabricated on a substrate employing a plurality of memory cells which require a first potential for reading data and a second higher potential for writing and erasing data and which employs a reference potential when data is read from said cells, an improvement disposed on said substrate comprising:
    first circuit means for erasing data in said cells, for applying a first potential to said cells, said first potential being different than said reference potential, and for reading data from said cells with said first potential applied to assure that said cells have been erased; and,
    second circuit means for writing data into said cells, and for applying a second potential to said cells, said second potential being different than said reference potential and said first potential, and for reading data from said cells with said second potential applied to determine if data has been written into said cells;
    whereby data in said cells is read with potentials other than said reference potential to assure that said cells are well programmed.

8. The improvement defined by claim 7 wherein said reference potential is a positive potential and said first potential is higher than said reference potential and said second potential is lower than said reference potential.

9. The improvement defined by claim 7 including;
    latching means for receiving and temporarily storing data;
    pulse generation means for generating pulses used to program said cells, said generation means coupled to receive said second potential;
    comparator means for comparing data in said latching means with data in said cells; and,
    control means for controlling said pulse generation means such that said pulses are repeatedly generated until data in said latching means matches data in said cells, said control means being coupled to said comparator means and said pulse generation means.

10. The improvement defined by claim 9 wherein said pulses and said generation means have a width substantially less than 10 milliseconds.

11. The improvement defined by claim 10 wherein said pulses from said generation means have ramped leading edges.

* * * * *